United States Patent
Hussell

(10) Patent No.: US 12,437,707 B2
(45) Date of Patent: Oct. 7, 2025

(54) PSEUDO-EXPONENTIAL ENCODING FOR LIGHT-EMITTING DEVICES AND RELATED METHODS

(71) Applicant: CreeLED, Inc., Durham, NC (US)

(72) Inventor: Christopher P. Hussell, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 18/475,620

(22) Filed: Sep. 27, 2023

(65) Prior Publication Data

US 2025/0104604 A1   Mar. 27, 2025

(51) Int. Cl.
G09G 3/32   (2016.01)

(52) U.S. Cl.
CPC ....... *G09G 3/32* (2013.01); *G09G 2310/0286* (2013.01); *G09G 2370/08* (2013.01)

(58) Field of Classification Search
None
See application file for complete search history.

(56) References Cited

U.S. PATENT DOCUMENTS

| | | | | |
|---|---|---|---|---|
| 5,058,048 A | * | 10/1991 | Gupta | G06F 7/483 |
| | | | | 708/507 |
| 5,317,526 A | * | 5/1994 | Urano | H03M 7/24 |
| | | | | 708/204 |
| 5,359,345 A | | 10/1994 | Hunter | |
| 5,748,793 A | * | 5/1998 | Sanpei | G06T 3/4023 |
| | | | | 375/240.03 |
| 6,016,038 A | | 1/2000 | Mueller et al. | |
| 6,088,445 A | * | 7/2000 | Chadha | H03H 17/0238 |
| | | | | 379/406.08 |

(Continued)

FOREIGN PATENT DOCUMENTS

| | | |
|---|---|---|
| CN | 1965340 A | 5/2007 |
| CN | 101926222 A | 12/2010 |

(Continued)

OTHER PUBLICATIONS

Notice of Reason for Rejection for Japanese Patent Application No. 2022-554701, mailed Sep. 19, 2023, 11 pages.

(Continued)

*Primary Examiner* — Patrick N Edouard
*Assistant Examiner* — Peijie Shen
(74) *Attorney, Agent, or Firm* — Withrow & Terranova, P.L.L.C.

(57) ABSTRACT

Light-emitting devices and, more particularly, light-emitting devices with pseudo-exponential encoding and related methods are disclosed. Pseudo-exponential encoding or pseudo-exponential transformation refers to encoding and decoding techniques that include placement of certain data bits while at least one data bit is introduced in a manner that deviates from exponential transformation. The deviation involves introducing the at least one data bit to avoid duplicate zero values that may otherwise be present during decoding. Exemplary light-emitting devices include light-emitting diode (LED) packages and/or LED displays. Pseudo-exponential encoding as described herein provides bit shifting and manipulation for increased dynamic range with reduced complexity and size of hardware resources.

23 Claims, 7 Drawing Sheets

(56) References Cited

U.S. PATENT DOCUMENTS

| | | | |
|---|---|---|---|
| 6,150,774 A | 11/2000 | Mueller et al. | |
| 6,166,496 A | 12/2000 | Lys et al. | |
| 6,211,626 B1 | 4/2001 | Lys et al. | |
| 6,292,901 B1 | 9/2001 | Lys et al. | |
| 6,388,388 B1* | 5/2002 | Weindorf | H05B 41/39 |
| | | | 315/157 |
| 6,538,626 B1 | 3/2003 | Nieberger et al. | |
| 7,206,001 B1 | 4/2007 | Crandall et al. | |
| 7,579,629 B2 | 8/2009 | Inoguchi | |
| 7,593,021 B1* | 9/2009 | Tynefield, Jr. | G09G 5/02 |
| | | | 345/604 |
| 8,111,001 B2 | 2/2012 | Underwood et al. | |
| 8,328,405 B2 | 12/2012 | Negley | |
| 8,922,458 B2 | 12/2014 | Sefton et al. | |
| 8,937,492 B1 | 1/2015 | Gideon | |
| 8,970,131 B2 | 3/2015 | Brandes et al. | |
| 9,414,454 B2 | 8/2016 | Brandes et al. | |
| 9,717,123 B1 | 7/2017 | Yao | |
| 10,368,411 B2 | 7/2019 | Zhang et al. | |
| 10,384,239 B2 | 8/2019 | Fedigan et al. | |
| 10,453,827 B1 | 10/2019 | Hussell et al. | |
| 10,663,418 B2 | 5/2020 | Magee et al. | |
| 10,682,675 B2 | 6/2020 | Magee et al. | |
| 10,695,805 B2 | 6/2020 | Magee et al. | |
| 10,908,414 B2 | 2/2021 | Revier et al. | |
| 11,974,371 B2 | 4/2024 | Wang et al. | |
| 12,014,677 B1 | 6/2024 | Hussell | |
| 2001/0028356 A1 | 10/2001 | Balogh | |
| 2002/0130627 A1 | 9/2002 | Morgan et al. | |
| 2003/0058885 A1 | 3/2003 | Sorenson et al. | |
| 2004/0100475 A1* | 5/2004 | Leather | G09G 5/363 |
| | | | 345/605 |
| 2004/0160199 A1 | 8/2004 | Morgan et al. | |
| 2004/0246278 A1 | 12/2004 | Elliott | |
| 2005/0253824 A1* | 11/2005 | Lin | G09G 3/3611 |
| | | | 345/204 |
| 2006/0022214 A1 | 2/2006 | Morgan et al. | |
| 2006/0108952 A1 | 5/2006 | Adler et al. | |
| 2006/0114269 A1 | 6/2006 | Chang-Ho et al. | |
| 2006/0125771 A1* | 6/2006 | Inuzuka | G09G 3/342 |
| | | | 345/102 |
| 2006/0168496 A1 | 7/2006 | Steele et al. | |
| 2007/0097055 A1 | 5/2007 | Takamura et al. | |
| 2007/0195025 A1 | 8/2007 | Korcharz et al. | |
| 2007/0231846 A1 | 10/2007 | Cosentino et al. | |
| 2007/0237165 A1 | 10/2007 | Chiang | |
| 2007/0296464 A1 | 12/2007 | Lewko | |
| 2008/0018261 A1 | 1/2008 | Kastner | |
| 2008/0062158 A1 | 3/2008 | Willis | |
| 2008/0136844 A1 | 6/2008 | Takada et al. | |
| 2008/0238950 A1 | 10/2008 | Saglam | |
| 2008/0245949 A1 | 10/2008 | Morimoto et al. | |
| 2009/0066526 A1 | 3/2009 | Marshall et al. | |
| 2009/0079362 A1 | 3/2009 | Shteynberg et al. | |
| 2009/0109168 A1 | 4/2009 | Lee et al. | |
| 2009/0147028 A1 | 6/2009 | Sefton et al. | |
| 2009/0164713 A1 | 6/2009 | Tsai et al. | |
| 2009/0179843 A1 | 7/2009 | Ackerman et al. | |
| 2009/0187925 A1 | 7/2009 | Hu et al. | |
| 2009/0201274 A1 | 8/2009 | Kuwabara et al. | |
| 2009/0230885 A1 | 9/2009 | Tanaka | |
| 2009/0278034 A1 | 11/2009 | Ackermann et al. | |
| 2009/0295819 A1* | 12/2009 | Buchner | G06T 15/04 |
| | | | 345/581 |
| 2010/0026208 A1 | 2/2010 | Shteynberg et al. | |
| 2010/0085295 A1 | 4/2010 | Zhao et al. | |
| 2010/0102734 A1 | 4/2010 | Quick et al. | |
| 2010/0156952 A1 | 6/2010 | Arai | |
| 2010/0214764 A1 | 8/2010 | Chaves et al. | |
| 2011/0057302 A1 | 3/2011 | Spehar et al. | |
| 2011/0141002 A1* | 6/2011 | Kim | G09G 3/342 |
| | | | 345/102 |
| 2012/0056864 A1 | 3/2012 | Aioanei | |
| 2012/0126711 A1 | 5/2012 | Suminoe et al. | |
| 2012/0147567 A1 | 6/2012 | Lee et al. | |
| 2012/0218754 A1 | 8/2012 | Maes | |
| 2012/0286674 A1 | 11/2012 | Takanashi | |
| 2012/0299480 A1 | 11/2012 | Peting et al. | |
| 2012/0306942 A1 | 12/2012 | Fujiwara et al. | |
| 2013/0057763 A1 | 3/2013 | Cha et al. | |
| 2013/0076250 A1 | 3/2013 | Logiudice | |
| 2013/0114021 A1 | 5/2013 | Illyama et al. | |
| 2013/0169172 A1 | 7/2013 | Kesterson et al. | |
| 2013/0228672 A1 | 9/2013 | Jung et al. | |
| 2014/0028776 A1 | 1/2014 | Kawamura | |
| 2014/0128941 A1 | 5/2014 | Williams | |
| 2014/0152535 A1* | 6/2014 | Zhang | H05B 45/46 |
| | | | 315/186 |
| 2014/0152902 A1 | 6/2014 | Morrisseau | |
| 2014/0265919 A1 | 9/2014 | Pope et al. | |
| 2014/0306966 A1 | 10/2014 | Kuo et al. | |
| 2015/0276144 A1 | 10/2015 | Tudhope et al. | |
| 2015/0319814 A1 | 11/2015 | Grotsch et al. | |
| 2015/0348496 A1 | 12/2015 | Santos, II et al. | |
| 2015/0377695 A1 | 12/2015 | Chang et al. | |
| 2016/0071467 A1 | 3/2016 | Elder et al. | |
| 2016/0161326 A1 | 6/2016 | Chang et al. | |
| 2016/0189605 A1 | 6/2016 | Ahn et al. | |
| 2016/0217762 A1 | 7/2016 | Moon et al. | |
| 2016/0293811 A1 | 10/2016 | Hussell et al. | |
| 2016/0314730 A1 | 10/2016 | Sampsell | |
| 2016/0358528 A1 | 12/2016 | Xie et al. | |
| 2017/0092198 A1 | 3/2017 | Ryu et al. | |
| 2017/0111969 A1* | 4/2017 | Zhao | H05B 45/10 |
| 2017/0135169 A1* | 5/2017 | Panek | H05B 45/397 |
| 2017/0168212 A1 | 6/2017 | Chen et al. | |
| 2017/0263828 A1 | 9/2017 | Mao et al. | |
| 2017/0294495 A1 | 10/2017 | Shyu et al. | |
| 2017/0330509 A1 | 11/2017 | Cok et al. | |
| 2017/0330856 A1 | 11/2017 | Zou et al. | |
| 2018/0033768 A1 | 2/2018 | Kumar et al. | |
| 2018/0035018 A1 | 2/2018 | Yamada et al. | |
| 2018/0076368 A1 | 3/2018 | Hussell | |
| 2018/0114800 A1 | 4/2018 | Pan | |
| 2018/0130441 A1 | 5/2018 | Jeon | |
| 2018/0138161 A1* | 5/2018 | Spiegler | H05B 45/22 |
| 2018/0182927 A1 | 6/2018 | Vampola et al. | |
| 2018/0247608 A1 | 8/2018 | Chen | |
| 2018/0261149 A1 | 9/2018 | Lin | |
| 2018/0348959 A1 | 12/2018 | Lin et al. | |
| 2019/0027082 A1 | 1/2019 | Van Belle | |
| 2019/0132921 A1 | 5/2019 | Rumer | |
| 2019/0132923 A1 | 5/2019 | Rumer | |
| 2019/0149792 A1 | 5/2019 | Luo et al. | |
| 2019/0302917 A1 | 10/2019 | Pan | |
| 2019/0335081 A1 | 10/2019 | Baar et al. | |
| 2019/0339573 A1* | 11/2019 | Wu | H05B 45/00 |
| 2019/0371974 A1 | 12/2019 | Hussell | |
| 2020/0105179 A1 | 4/2020 | Greenebaum et al. | |
| 2020/0105221 A1 | 4/2020 | Marcu et al. | |
| 2020/0135093 A1 | 4/2020 | Prathaban et al. | |
| 2020/0184900 A1 | 6/2020 | Shin et al. | |
| 2020/0203319 A1 | 6/2020 | Lee et al. | |
| 2020/0251050 A1 | 8/2020 | Yee | |
| 2020/0264476 A1* | 8/2020 | Yashiki | G09G 3/3426 |
| 2020/0309357 A1 | 10/2020 | Hussell et al. | |
| 2020/0312220 A1 | 10/2020 | Hussell et al. | |
| 2020/0312222 A1 | 10/2020 | Hussell | |
| 2020/0312225 A1 | 10/2020 | Hussell | |
| 2020/0312226 A1 | 10/2020 | Hussell | |
| 2020/0312231 A1 | 10/2020 | Hussell | |
| 2020/0335042 A1 | 10/2020 | Son et al. | |
| 2021/0005761 A1 | 1/2021 | Tsai et al. | |
| 2021/0399183 A1 | 12/2021 | Hussell et al. | |
| 2022/0044643 A1 | 2/2022 | Gu et al. | |
| 2022/0198989 A1 | 6/2022 | Park et al. | |
| 2023/0252934 A1 | 8/2023 | Hussell | |

(56) References Cited

U.S. PATENT DOCUMENTS

| | | | |
|---|---|---|---|
| 2024/0159840 A1 | 5/2024 | Hussell | |
| 2024/0274063 A1 | 8/2024 | Hussell | |

FOREIGN PATENT DOCUMENTS

| | | | |
|---|---|---|---|
| CN | 102483897 | A | 5/2012 |
| CN | 205546092 | U | 8/2016 |
| CN | 207852672 | U | 9/2018 |
| CN | 110782828 | A | 2/2020 |
| EP | 1306827 | B1 | 5/2003 |
| EP | 2400682 | A1 | 12/2011 |
| EP | 2515291 | B1 | 11/2016 |
| JP | 2002229502 | A | 8/2002 |
| JP | 2010091825 | A | 4/2010 |
| JP | 201773411 | A | 4/2017 |
| KR | 1020050111433 | A | 11/2005 |
| KR | 20110082137 | A | 7/2011 |
| WO | 2005048231 | A1 | 5/2005 |
| WO | 2020030993 | A1 | 2/2020 |
| WO | 2021183299 | A1 | 9/2021 |

OTHER PUBLICATIONS

Advisory Action for U.S. Appl. No. 16/437,878, mailed Nov. 28, 2023, 3 pages.
Non-Final Office Action for U.S. Appl. No. 18/320,498, mailed Dec. 6, 2023, 12 pages.
Decision to Grant for Japanese Patent Application No. 2022-554701, mailed Feb. 20, 2024, 6 pages.
International Search Report and Written Opinion for International Patent Application No. PCT/US2023/079460, mailed Feb. 23, 2024, 16 pages.
Final Office Action for U.S. Appl. No. 16/437,878, mailed Apr. 5, 2024, 21 pages.
Final Office Action for U.S. Appl. No. 18/320,498, mailed Feb. 27, 2024, 14 pages.
Notice of Allowance for U.S. Appl. No. 17/081,522, mailed Apr. 5, 2024, 8 pages.
Notice of Allowance for U.S. Appl. No. 18/298,049, mailed Feb. 2, 2024, 9 pages.
Advisory Action and Examiner-Initiated Interview Summary for U.S. Appl. No. 17/081,522, mailed Feb. 16, 2024, 5 pages.
Notification to Grant for Chinese Patent Application No. 202080025541.3, mailed Mar. 20, 2024, 6 pages.
Notice of Preliminary Rejection for Korean Patent Application No. 10-2022-7034893, mailed Mar. 7, 2024, 17 pages.
Invitation to Pay Additional Fees and Partial Search for International Patent Application No. PCT/US2024/013657, mailed Apr. 15, 2024, 11 pages.
Written Decision on Registration for Korean Patent Application No. 10-2021-7035365, mailed Mar. 18, 2024, 7 pages.
Advisory Action and Examiner-Initiated Interview Summary for U.S. Appl. No. 18/320,498, mailed May 3, 2024, 4 pages.
Examination Report for European Patent Application No. 21713274.5, mailed May 28, 2024, 7 pages.
Notice of Reason for Rejection for Japanese Patent Application No. 2023-113594, mailed May 28, 2024, 10 pages.
Notification to Grant for Korean Patent Application No. 10-2022-7034893, mailed Jun. 18, 2024, 5 pages.
International Search Report and Written Opinion for International Patent Application No. PCT/US2024/013657, mailed Jun. 12, 2024, 17 pages.
Invitation to Pay Additional Fees and Partial Search for International Patent Application No. PCT/US2024/021668, mailed Jul. 5, 2024, 13 pages.
Advisory Action and Examiner-Initiated Interview Summary for U.S. Appl. No. 16/437,878, mailed Jun. 4, 2024, 4 pages.
Non-Final Office Action for U.S. Appl. No. 18/320,498, mailed May 28, 2024, 18 pages.
Notice of Preliminary Rejection for Korean Patent Application No. 10-2024-7018777, mailed Jun. 25, 2024, 19 pages.
International Search Report and Written Opinion for International Patent Application No. PCT/US2024/021668, mailed Aug. 26, 2024, 20 pages.
Notice of Allowance for U.S. Appl. No. 16/437,878, mailed Jul. 29, 2024, 11 pages.
Final Office Action for U.S. Appl. No. 18/320,498, mailed Sep. 6, 2024, 21 pages.
Author Unknown, "APA102-2020 Super LED," Datasheet, Shenzhen LED Color Opto Electronic Co., Ltd., retrieved Apr. 10, 2019 from http://www.led-color.com/upload/201604/APA102-2020%20SMD%20LED.pdf, 6 pages.
Author Unknown, "APA102C: RGB Full Color LED control IC," iPixel LED, Shiji Lighting, retrieved Apr. 10, 2019 from https://cdn-shop.adafruit.com/datasheets/APA102.pdf, 5 pages.
Author Unknown, "Self-clocking signal," Jul. 1, 2018, Wikipedia, https://en.wikipedia.org/w/index.php?title=Self-clocking_signal&oldid=848405107, 3 pages.
Author Unknown, "Serial communication," May 2, 2019, Wikipedia, https://en.wikipedia.org/w/index.php?title=Serial_communication&oldid=895110130, 4 pages.
Author Unknown, "SK6812 Technical Data Sheet," Shenzhen LED Color Optoelectronic Co., Ltd., retrieved Apr. 10, 2019 from https://cdn-shop.adafruit.com/product-files/1138/SK6812+LED+datasheet+.pdf, 8 pages.
Author Unknown, "SK6812RGBW Specification: Integrated Light Source Intelligent Control of Chip-on-Top SMD Type LED," Jul. 31, 2015, Dongguang Opsco Optpelectronics Co., Ltd., 16 pages.
Author Unknown, "WS2811: Signal line 256 Gray level 3 channal Constant current LED drive IC," Worldsemi, retrieved May 23, 2019 from https://cdn-shop.adafruit.com/datasheets/WS2811.pdf, 7 pages.
Author Unknown, "WS2812: Intelligent control LED integrated light source," Worldsemi, retrieved Apr. 10, 2019 from https://cdn-shop.adafruit.com/datasheets/WS2811.pdf, 5 pages.
Zhu, K., "EC20-6812 Specification: Embedded Control LED," Dec. 19, 2018, Shenzhen Normand Electronic Co., Ltd., 35 pages.
Invitation to Pay Additional Fees and Partial Search for International Patent Application No. PCT/US2020/023140, mailed Jun. 16, 2020, 25 pages.
International Search Report and Written Opinion for International Patent Application No. PCT/US2020/023140, mailed Aug. 11, 2020, 27 pages.
Non-Final Office Action for U.S. Appl. No. 16/369,003, mailed Aug. 21, 2020, 15 pages.
Non-Final Office Action for U.S. Appl. No. 16/381,116, mailed Aug. 21, 2020, 8 pages.
Non-Final Office Action for U.S. Appl. No. 16/437,878, mailed Aug. 21, 2020, 14 pages.
Non-Final Office Action for U.S. Appl. No. 16/542,923, mailed Aug. 21, 2020, 15 pages.
Reason for Rejection for Japanese Patent Application No. 2021-560354, mailed Oct. 11, 2022, 7 pages.
Invitation to Pay Additional Fees and Partial Search for International Patent Application No. PCT/US2021/019708, mailed May 25, 2021, 17 pages.
International Search Report and Written Opinion for International Patent Application No. PCT/US2021/019708, mailed Jul. 19, 2021, 23 pages.
Final Office Action for U.S. Appl. No. 16/369,003, mailed Dec. 9, 2020, 17 pages.
Advisory Action for U.S. Appl. No. 16/369,003, mailed Feb. 11, 2021, 3 pages.
Non-Final Office Action for U.S. Appl. No. 16/369,003, mailed Apr. 1, 2021, 18 pages.
Final Office Action for U.S. Appl. No. 16/369,003, mailed Jul. 22, 2021, 16 pages.
Advisory Action for U.S. Appl. No. 16/369,003, mailed Sep. 23, 2021, 3 pages.
Non-Final Office Action for U.S. Appl. No. 16/369,003, mailed Nov. 12, 2021, 19 pages.

(56) References Cited

OTHER PUBLICATIONS

Final Office Action for U.S. Appl. No. 16/369,003, mailed Mar. 31, 2022, 23 pages.
Non-Final Office Action for U.S. Appl. No. 16/369,003, mailed Jul. 21, 2022, 29 pages.
Final Office Action for U.S. Appl. No. 16/369,003, mailed Nov. 1, 2022, 23 pages.
Final Office Action for U.S. Appl. No. 16/369,003, mailed Nov. 3, 2022, 24 pages.
Final Office Action for U.S. Appl. No. 16/369,003, mailed Dec. 12, 2022, 24 pages.
Final Office Action for U.S. Appl. No. 16/381,116, mailed Dec. 10, 2020, 10 pages.
Advisory Action for U.S. Appl. No. 16/381,116, mailed Feb. 11, 2021, 3 pages.
Non-Final Office Action for U.S. Appl. No. 16/381,116, mailed Apr. 1, 2021, 12 pages.
Final Office Action for U.S. Appl. No. 16/381,116, mailed Jul. 22, 2021, 9 pages.
Non-Final Office Action for U.S. Appl. No. 16/381,116, mailed Nov. 12, 2021, 10 pages.
Final Office Action for U.S. Appl. No. 16/381,116, mailed Mar. 2, 2022, 17 pages.
Advisory Action and Examiner-Initiated Interview Summary for U.S. Appl. No. 16/381,116, mailed May 6, 2022, 4 pages.
Non-Final Office Action for U.S. Appl. No. 16/381,116, mailed Jun. 22, 2022, 17 pages.
Final Office Action for U.S. Appl. No. 16/381,116, mailed Oct. 4, 2022, 17 pages.
Final Office Action for U.S. Appl. No. 16/437,878, mailed Dec. 9, 2020, 14 pages.
Advisory Action and Examiner-Initiated Interview Summary for U.S. Appl. No. 16/437,878, mailed Feb. 11, 2021, 4 pages.
Non-Final Office Action for U.S. Appl. No. 16/437,878, mailed Apr. 1, 2021, 16 pages.
Non-Final Office Action for U.S. Appl. No. 16/437,878, mailed Apr. 23, 2021, 17 pages.
Final Office Action for U.S. Appl. No. 16/437,878, mailed Sep. 1, 2021, 16 pages.
Non-Final Office Action for U.S. Appl. No. 16/437,878, mailed Dec. 15, 2021, 17 pages.
Final Office Action for U.S. Appl. No. 16/437,878, mailed Mar. 31, 2022, 22 pages.
Final Office Action for U.S. Appl. No. 16/437,878, mailed Jul. 21, 2022, 23 pages.
Non-Final Office Action for U.S. Appl. No. 16/437,878, mailed Oct. 27, 2022, 21 pages.
Final Office Action for U.S. Appl. No. 16/542,923, mailed Dec. 10, 2020, 16 pages.
Advisory Action and Examiner-Initiated Interview Summary for U.S. Appl. No. 16/542,923, mailed Feb. 11, 2021, 4 pages.
Non-Final Office Action for U.S. Appl. No. 16/542,923, mailed Apr. 1, 2021, 19 pages.
Decision to Grant for Japanese Patent Application No. 2023-113594, mailed Nov. 7, 2024, 5 pages.
Decision on Appeal for U.S. Appl. No. 16/381,116, mailed Sep. 23, 2024, 14 pages.
Advisory Action for U.S. Appl. No. 18/320,498, mailed Nov. 6, 2024, 4 pages.
Non-Final Office Action for U.S. Appl. No. 18/655,639, mailed Nov. 22, 2024, 10 pages.
Non-Final Office Action for U.S. Appl. No. 16/437,878, mailed Jan. 3, 2024, 20 pages.
Final Office Action for U.S. Appl. No. 17/081,522, mailed Dec. 13, 2023, 15 pages.
First Office Action for Chinese Patent Application No. 2020800255413, mailed Oct. 25, 2023, 19 pages.
Final Office Action for U.S. Appl. No. 16/542,923, mailed Jul. 22, 2021, 19 pages.
Advisory Action for U.S. Appl. No. 16/542,923, mailed Sep. 23, 2021, 3 pages.
Non-Final Office Action for U.S. Appl. No. 16/542,923, mailed Nov. 12, 2021, 21 pages.
Final Office Action for U.S. Appl. No. 16/542,923, mailed Mar. 2, 2022, 21 pages.
Advisory Action and Examiner-Initiated Interview Summary for U.S. Appl. No. 16/542,923, mailed May 6, 2022, 4 pages.
Non-Final Office Action for U.S. Appl. No. 16/542,923, mailed Jun. 22, 2022, 23 pages.
Final Office Action for U.S. Appl. No. 16/542,923, mailed Oct. 7, 2022, 23 pages.
Final Office Action for U.S. Appl. No. 16/542,923, mailed Nov. 14, 2022, 29 pages.
Advisory Action and Examiner-Initiated Interview Summary for U.S. Appl. No. 16/542,923, mailed Dec. 15, 2022, 4 pages.
Non-Final Office Action for U.S. Appl. No. 16/543,009, mailed Apr. 1, 2021, 14 pages.
Final Office Action for U.S. Appl. No. 16/543,009, mailed Jul. 23, 2021, 15 pages.
Advisory Action for U.S. Appl. No. 16/543,009, mailed Sep. 23, 2021, 3 pages.
Final Office Action for U.S. Appl. No. 16/543,009, mailed Nov. 12, 2021, 15 pages.
Non-Final Office Action for U.S. Appl. No. 16/543,009, mailed Mar. 4, 2022, 15 pages.
Final Office Action for U.S. Appl. No. 16/543,009, mailed Jun. 10, 2022, 16 pages.
Non-Final Office Action for U.S. Appl. No. 16/543,009, mailed Oct. 7, 2022, 16 pages.
Final Office Action for U.S. Appl. No. 16/543,009, mailed Jan. 19, 2023, 19 pages.
Non-Final Office Action for U.S. Appl. No. 16/815,101, mailed Nov. 12, 2021, 13 pages.
Final Office Action for U.S. Appl. No. 16/815,101, mailed Mar. 2, 2022, 14 pages.
Advisory Action and Examiner-Initiated Interview Summary for U.S. Appl. No. 16/815,101, mailed May 6, 2022, 4 pages.
Non-Final Office Action for U.S. Appl. No. 16/815,101, mailed Jun. 22, 2022, 17 pages.
Final Office Action for U.S. Appl. No. 16/815,101, mailed Oct. 7, 2022, 16 pages.
Advisory Action and Examiner-Initiated Interview Summary for U.S. Appl. No. 16/815,101, mailed Dec. 20, 2022, 4 pages.
Ex Parte Quayle Action for U.S. Appl. No. 16/815,101, mailed Jan. 19, 2023, 7 pages.
Non-Final Office Action for U.S. Appl. No. 17/081,522, mailed Jan. 20, 2022, 18 pages.
Final Office Action for U.S. Appl. No. 17/081,522, mailed Apr. 28, 2022, 10 pages.
Advisory Action for U.S. Appl. No. 17/081,522, mailed Jul. 5, 2022, 3 pages.
Non-Final Office Action for U.S. Appl. No. 17/081,522, mailed Aug. 17, 2022, 9 pages.
Final Office Action for U.S. Appl. No. 17/081,522, mailed Nov. 10, 2022, 10 pages.
Advisory Action and Examiner-Initiated Interview Summary for U.S. Appl. No. 17/081,522, mailed Jan. 23, 2023, 4 pages.
Non-Final Office Action for U.S. Appl. No. 16/906,129, mailed Jun. 9, 2022, 14 pages.
Final Office Action for U.S. Appl. No. 16/906,129, mailed Dec. 12, 2022, 15 pages.
Notice of Allowance and Examiner-Initiated Interview Summary for U.S. Appl. No. 16/542,923, mailed Mar. 17, 2023, 11 pages.
Notice of Allowance for U.S. Appl. No. 16/815,101, mailed Feb. 13, 2023, 10 pages.
Non-Final Office Action for U.S. Appl. No. 17/081,522, mailed Mar. 2, 2023, 11 pages.
Notice of Allowance for U.S. Appl. No. 16/906,129, mailed Feb. 27, 2023, 10 pages.
Notice of Reason for Rejection for Japanese Patent Application No. 2021-560354, mailed Mar. 10, 2023, 4 pages.

(56) References Cited

OTHER PUBLICATIONS

International Search Report and Written Opinion for International Patent Application No. PCT/US2023/061653, mailed Apr. 6, 2023, 24 pages.

Notice of Allowance for U.S. Appl. No. 16/369,003, mailed Mar. 30, 2023, 9 pages.

Advisory Action and Examiner-Initiated Interview Summary for U.S. Appl. No. 16/437,878, mailed Apr. 14, 2023, 4 pages.

Non-Final Office Action for U.S. Appl. No. 16/437,878, mailed May 31, 2023, 19 pages.

Advisory Action and Examiner-Initiated Interview Summary for U.S. Appl. No. 16/543,009, mailed Mar. 28, 2023, 4 pages.

Notice of Allowance for U.S. Appl. No. 16/543,009, mailed May 24, 2023, 10 pages.

Final Office Action for U.S. Appl. No. 17/081,522, mailed Jun. 7, 2023, 11 pages.

Examination Report for European Patent Application No. 20718953.1, mailed Jul. 6, 2023, 11 pages.

Author Unknown, "Arri LogC4: Logarithmic Color Space," Specification, May 12, 2023, Arri Ag, 20 pages.

Final Office Action for U.S. Appl. No. 16/437,878, mailed Sep. 19, 2023, 20 pages.

Non-Final Office Action for U.S. Appl. No. 17/081,522, mailed Sep. 13, 2023, 13 pages.

Non-Final Office Action for U.S. Appl. No. 18/065,397, mailed Aug. 28, 2023, 9 pages.

Non-Final Office Action for U.S. Appl. No. 18/298,049, mailed Oct. 5, 2023, 9 pages.

International Search Report and Written Opinion for International Patent Application No. PCT/US2024/048284, mailed Dec. 17, 2024, 11 pages.

Office Action for Taiwanese Patent Application No. 113135492, mailed May 28, 2025, 13 pages.

\* cited by examiner

PSEUDO-EXPONENTIAL ENCODING FOR LIGHT-EMITTING DEVICES AND RELATED METHODS

FIELD OF THE DISCLOSURE

The present disclosure relates to light-emitting devices and, more particularly, to light-emitting devices with pseudo-exponential encoding and related methods.

BACKGROUND

Light-emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions.

LEDs have been widely adopted in various illumination contexts, for backlighting of liquid crystal display (LCD) systems (e.g., as a substitute for cold cathode fluorescent lamps) and for direct-view LED displays. Applications utilizing LED arrays include vehicular headlamps, roadway illumination, light fixtures, and various indoor, outdoor, and specialty contexts. Desirable characteristics of LED devices include high luminous efficacy and long lifetime.

Large format multi-color direct-view LED displays (including full color LED video screens) typically include numerous individual LED panels, packages, and/or components providing image resolution determined by the distance between adjacent pixels. Direct-view LED displays typically include three-color displays with arrayed red, green, and blue (RGB) LEDs, and two-color displays with arrayed red and green (RG) LEDs. For many LED display systems, it is desirable to form LED color groups for each pixel such as primary colors red, green, and blue (RGB) that define vertices of a triangle (or polygon) on a chromaticity diagram. This polygon defines the so-called color gamut of the display device, the area of which describes all the possible colors that the display device is capable of producing. Driver printed circuit boards for controlling LED displays are typically densely populated with electrical devices including capacitors, field effect transistors (FETs), decoders, microcontrollers, and the like for driving the pixels of the display. As pixel pitches continue to decrease for higher resolution displays, the density of such electrical devices scales higher corresponding to the increased number of pixels for a given panel area. This tends to add higher complexity and costs to LED panels for display applications.

The art continues to seek improved LED array devices with small pixel pitches while overcoming limitations associated with conventional devices and production methods.

SUMMARY

The present disclosure relates to light-emitting devices and, more particularly, to light-emitting devices with pseudo-exponential encoding and related methods. Pseudo-exponential encoding or pseudo-exponential transformation refers to encoding and decoding techniques that include placement of certain data bits while at least one data bit is introduced in a manner that deviates from exponential transformation. The deviation involves introducing the at least one data bit to avoid duplicate zero values that may otherwise be present during decoding. Exemplary light-emitting devices include light-emitting diode (LED) packages and/or LED displays. Pseudo-exponential encoding as described herein provides bit shifting and manipulation for increased dynamic range with reduced complexity and size of hardware resources.

In one aspect, a method of light output control for a light-emitting diode (LED) device comprises: receiving compressed data comprising a first set of data bits and a second set of data bits, wherein the first set of data bits is a mantissa and the second set of data bits is an exponent; conveying the mantissa to an internal register in a first position determined by the exponent; introducing a predetermined bit value to the internal register in a second position determined by the exponent; and driving at least one LED chip. In certain embodiments, the first position correlates to taking the value of two to the exponential power of the exponent when the exponent is not zero, and the first position is equivalent to the case having the exponent equal to one when the exponent is zero. In certain embodiments, the predetermined bit value is a single bit with a value of one. In certain embodiments, the predetermined bit value is placed in a next more significant position immediately adjacent to the mantissa if the exponent is not zero. In certain embodiments: conveying the mantissa to the internal register comprises applying a first shift by shifting the mantissa into the internal register; and introducing the predetermined bit value comprises applying a second shift where the predetermined bit value is shifted into the internal register. In certain embodiments, applying the second shift comprises shifting a bit value of zero for a data bit when the exponent is zero and shifting a bit value of one for the data bit for all other exponent values. The method may further comprise calculating a modified exponent by taking the ones' complement of the exponent. In certain embodiments, the modified exponent is further modified subtracting a value of one when the exponent is zero. In certain embodiments, the internal register is further shifted according to the modified exponent. The method may further comprise sending contents of the internal register to circuitry for driving the at least one LED chip. In certain embodiments, the circuitry comprises at least one pulse width modulation (PWM) processor and driver circuitry coupled to the at least one LED chip. In certain embodiments, the driver circuitry comprises a plurality of current sources configured to provide varying current levels based on an output PWM signal of the at least one PWM processor. In certain embodiments, the at least one LED chip, the driver circuitry, and the at least one PWM processor are integrated together to form an LED package. In certain embodiments, the first shift and the second shift are performed from left to right within the shift register. In certain embodiments, the first shift and the second shift are performed from right to left within the shift register.

In another aspect, a light-emitting device comprises: a light-emitting diode (LED) chip; a serial interface configured to receive compressed data comprising a first set of data bits and a second set of data bits, wherein the first set of data bits is a mantissa and the second set of data bits is an exponent; and a decoder comprising an internal register, the decoder configured to: convey the mantissa to the internal register in a first position determined by the exponent; and introduce a predetermined bit value to the internal register in a second position determined by the exponent. In certain embodiments, the first position correlates to taking the value of two to the exponential power of the exponent when the exponent is not zero, and the first position is equivalent to the case having the exponent equal to one when the exponent is zero. In certain embodiments, the predetermined bit value is placed in a next more significant position immediately adjacent to the mantissa if the exponent is not zero. In certain embodiments, the decoder is configured to convey the mantissa by applying a first shift by shifting the mantissa into the shift register, and introduce the predetermined bit value by applying a second shift where the predetermined bit value is shifted into the internal register. In certain embodiments, the decoder is configured to apply the second shift by shifting a bit value of zero for the predetermined bit value when the exponent is zero or shifting a bit value of one for the predetermined bit value for all other exponent values. In certain embodiments, the decoder is configured to calculate a modified exponent that is shifted into the internal register, wherein if the exponent is zero, the modified exponent is calculated by taking the ones' complement of the exponent and then subtracting a value of one, and wherein for all other exponent values, the modified exponent is calculated by only taking the ones' complement of the exponent. In certain embodiments, the internal register is further shifted according to the modified exponent.

The light-emitting device may further comprise: driver circuitry coupled to the LED chip, the driver circuitry configured to drive the LED chip based on contents of the internal register; and a pulse width modulation (PWM) processor coupled to driver circuitry, the PWM processor configured to receive the contents of the internal register. In certain embodiments, the PWM processor comprises a plurality of current sources configured to provide varying current levels to the LED chip. In certain embodiments, the light-emitting device is an LED package that comprises the LED chip and an active electrical element that is integrated within the LED package, the active electrical element comprising the serial interface, the decoder, the driver circuitry, and the PWM processor.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
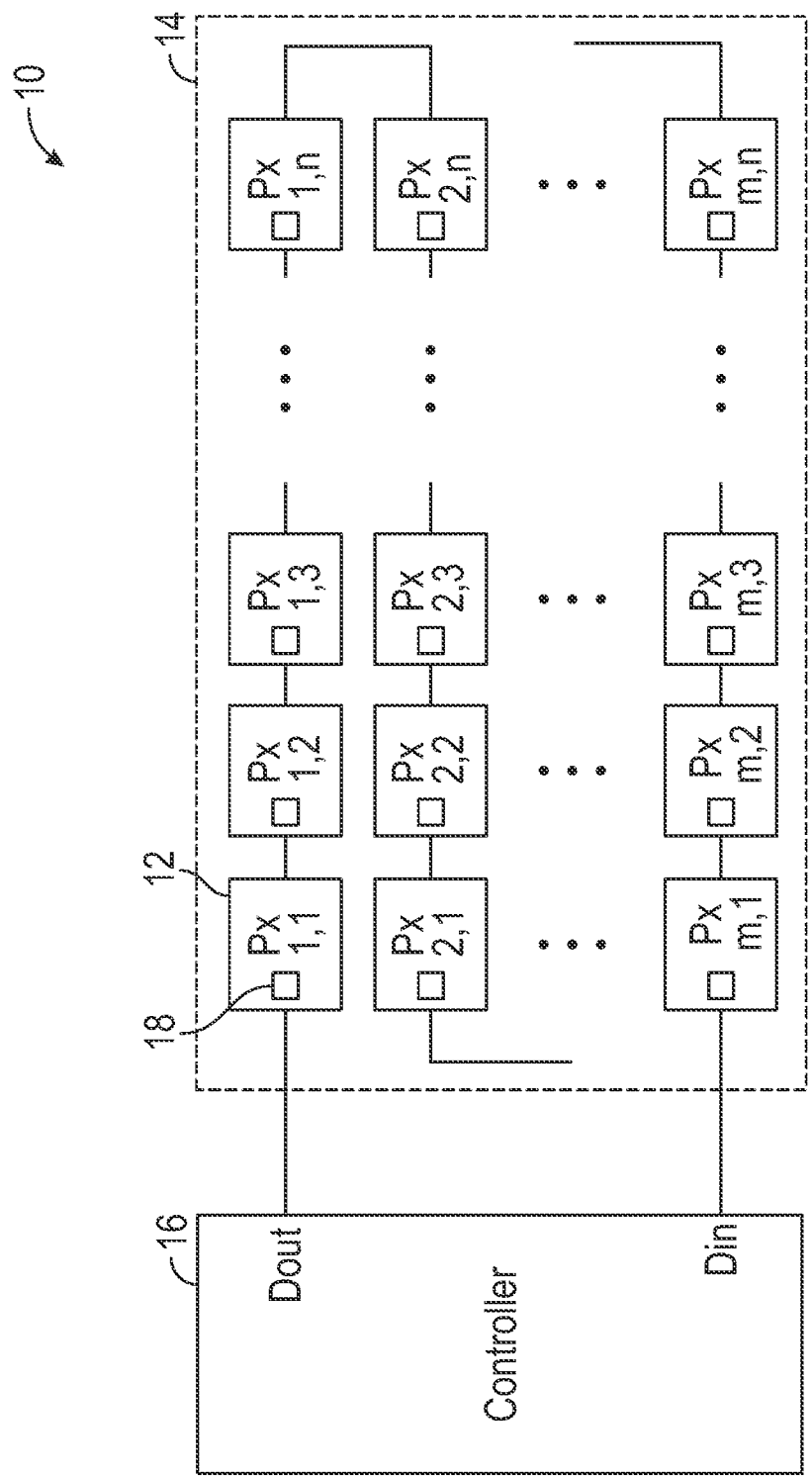
FIG. 1 is a block diagram illustrating a system level control scheme for a lighting device using cascade communication for serially connected light-emitting diode (LED) packages according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting devices and, more particularly, to light-emitting devices with pseudo-exponential encoding and related methods. Pseudo-exponential encoding or pseudo-exponential transformation refers to encoding and decoding techniques that include placement of certain data bits while at least one data bit is introduced in a manner that deviates from exponential transformation. The deviation involves introducing the at least one data bit to avoid duplicate zero values that may otherwise be present during decoding. Exemplary light-emitting devices include light-emitting diode (LED) packages and/or LED displays. Pseudo-exponential encoding as described herein provides bit shifting and manipulation for increased dynamic range with reduced complexity and size of hardware resources.

In cascade digital communication, multiple electronic devices are arranged as repeaters to successively receive serial communication for operation. In the context of fine-pitch video displays, multiple LED packages are serially arranged as LED pixels to receive cascade communication. Incoming signals to each LED pixel are produced by another element, such as a master controller or the previous LED pixel, and the bitstream of incoming signals is derived from clock domains of one or more preceding devices. Proper distribution of communication signals to thousands of LED pixels creates challenges. Small sizes are required for LED packages to form pixels of high-resolution video displays and these size constraints provide further challenges.

As used herein, the terms "data stream" and "communication channel" may at times be used interchangeably. However, a "data stream" generally refers to a non-physical representation of data over time that flows through a set of at least one communication channel as well as the internal wiring and storage registers within various elements such as controllers and active electrical elements. A data stream may also be referred to as digital communication between two elements, such as a controller element that transmits digital communication and a receiver element that receives the digital communication. A "communication channel" generally refers to a physical medium through which the data stream is conveyed. For example, a communication channel may comprise a wire with associated electrical elements, an optical fiber, or even air as in the case of radio, light, or sound waves. A given physical channel could also be divided up in time or frequencies to allow multiple "communication channels" within one medium at once such as changing to a different frequency band. In certain aspects, communication channels may embody serial digital communication channels. Certain aspects relate to a binary communication channel that is a single wire referenced to a common conductor such as ground, which commonly can only hold one value at a time which is high or low voltage (e.g., digital "0" or "1") and is controlled by the output register of the preceding device. Two-wire differential signaling methods are also contemplated, but the preferred embodiment shown here refers to the single-wire approach primarily because of the added complexity of providing more traces with fine pitch displays.

In certain aspects, the present disclosure relates to light-emitting devices including LEDs, LED packages, and related LED displays and, more particularly, to active control of LEDs within LED displays. LED displays may include rows and columns of LEDs that form an array of LED pixels. A particular LED pixel may include a cluster of LED chips of the same color or multiple colors, with an exemplary LED pixel including a red LED chip, a green LED chip, and a blue LED chip. In certain embodiments, an LED package includes a plurality of LED chips that form at least one LED pixel, and a plurality of such LED packages may be arranged to form an array of LED pixels for an LED display. Each LED package may include its own active electrical element that is configured to receive a control signal and actively maintain an operating state, such as brightness or grey level or a color select signal for the LED chips of the LED device while other LED devices are being addressed. In certain embodiments, the active electrical element may include active circuitry that includes one or more of a driver device, a signal conditioning or transformation device, a memory device, a decoder device, an electrostatic discharge (ESD) protection device, a thermal management device, a detection device, a voltage and/or current sensing device, a command processing device, and other circuitry, among others. The active electrical element further includes circuitry to facilitate communication with multiple uncorrelated clock domains, including an original clock domain from a controller and a local clock domain derived within the active electrical element. In this regard, each LED pixel of an LED display may be configured for operation with active matrix addressing with mixed clock domain communication. The active electrical element may be configured to receive one or more of an analog control signal, an encoded analog control signal, a digital control signal, and an encoded digital control signal. In such arrangements, strings of LED packages, each with their own active electrical element, may be arranged for serial communication where each active electrical element receives data from a data stream and transmits data to the next active electrical element in the string of LED packages.

For active matrix addressing, each LED pixel is configured to actively maintain an operating state or otherwise control the driving state, such as brightness or grey level or color select, while other LED pixels are being addressed, thereby allowing each LED pixel to maintain or otherwise independently control their driving state and provide improved display and/or image recording with photographic equipment by reducing or eliminating effects caused by lower-frequency pulsing beating of the display light output with other non-synchronized equipment (e.g., lighting sources, other pulsed displays, or image capture equipment). Accordingly, each LED pixel may be configured to hold its respective operating state with a continuous drive signal, inclusive of pulse-width modulation (PWM), rather than by conventional methods using time division multiplexed signals scanning among groups of pixels that often result in the addition of low frequency components to the drive signals associated with passive matrix addressing. In this regard, each LED pixel may include an active electrical chip or an active electrical element that may include a memory device and the ability to alter a driving condition of the LED pixel based on a state stored in the memory of the active electrical element. In certain embodiments, the continuous drive signal is a constant analog drive current, and in other embodiments where the brightness level may be controlled by pulsed methods such as PWM, the continuous drive signal may refer to a PWM signal that is not interrupted by the time division multiplexed scanning of other LED pixels within the array or within a sub-array. In various embodiments, an active electrical element comprises an integrated circuit chip, an application-specific integrated circuit (ASIC), a microcontroller, or a field-programmable gate array (FPGA). In certain embodiments, active electrical elements may be configured to be programmable or reprogrammable after they are manufactured through various memory elements and logic that are incorporated within the active electrical elements.

As used herein, the terms "active electrical chip," "active electrical element," or "active electrical component" include any chip or component that is able to alter a driving condition of an LED based on memory or other information that may be stored within a chip or component. As used herein, the terms "active LED pixel" and "smart LED pixel" may be used interchangeably and may refer to a device that includes one or more LED devices or chips that form a pixel and an active electrical element or chip as described above. In certain embodiments, each LED pixel may comprise a single LED package that is configured as an active LED package that includes multiple LED chips and an active electrical element as described above. In this manner, the number of separate electrical devices needed for the LED display may be reduced, such as the separate electrical devices located on the backsides of LED panels of the LED display as previously described. Additionally, overall operating powers needed for operation of the LED panels may be reduced.

Performance of LED displays continues to advance. Previously, LED displays were more adept for static images such as LED signs rather than dynamic application such as video displays since many of the performance metrics expected for good video image display were lacking. Various performance metrics needed for consideration of LEDs for high-quality video display include resolution, contrast, viewing angle, dynamic range, brightness, frame rate, and color gamut, among others. Recent advancements in LED packages, improvements in LED driver quality, and cost reductions have greatly improved the resolution, among other requirements. As the resolution has increased, the packing density of LED packages, such as on printed circuit boards (PCBs), has also increased and become more complex. The driving of LEDs within LED packages to achieve high dynamic range simultaneously with high frame and refresh rates remains challenging. This is because current driving techniques require remote drivers placed on the opposing side of PCBs containing LED arrays. Packing density constraints dictate that the drivers need to be shared via time division multiplexing techniques, such as raster scan. As the preferred driving techniques for LEDs utilize PWM to set the brightness, ever-higher frequencies are required to achieve high dynamic range. Consequently, the dynamic range is limited by the highest frequency pulse that can be delivered in view of parasitic resistance, capacitance, and inductance. LED packages arranged as pixels for cascade serial communication afford the opportunity to provide drivers local to each LED package, thereby providing improved dynamic range by removing the need for shared drivers and greatly reducing the parasitic resistance, capacitance, and inductance.

For LED displays, a dynamic range of greater than 1000:1 is considered decent while a dynamic range of about 1,000,000:1 is desirable. Some other display technologies such as liquid crystal display screens claim to have such high-performance dynamic range by using localized dimming. PWM is often applied to LEDs through a constant-current driver. In this regard, at any one current the brightness range can be anywhere from a minimum pulse width to a full and constant-on. Furthermore, the PWM period should be such that the blink rate of the minimum pulse isn't noticed, such as a rate of greater than 30 hertz (Hz). In this regard, to have 1,000,000:1 dynamic range, a dedicated PWM driver with a 30 megahertz (MHz) clock is needed. Some display technologies use 60 MHz, particularly if PWM drivers are multiplexed. However, parasitic power dissipation becomes significant at the higher clock rates, so this solution for high dynamic range may be undesirable.

The human eye can perceive around 20 stops of dynamic range (1,000,000:1) within one lighting condition and can adjust to lighting conditions over a much larger range. Having even more dynamic range is desired to provide for various lighting levels. Additional needs may include providing for calibration and thermal compensation. In this regard, 16,000,000:1 may be a reasonable target for next-generation displays. If the upper limit for the PWM clock frequency does not provide for the targeted dynamic range, one approach may involve changing the current. However, the switching of the PWM drive from one current to another makes it difficult to match the observed LED brightness from one current to another. Accordingly, there may be a brightness discontinuity associated with the change of current if extreme measures are not taken to calibrate and adjust the PWM signal as compensation. Additionally, performance differences over temperature makes this task even more difficult. Therefore, in most systems where PWM is used, even with the ability to change current, a current is selected and fixed for the whole dynamic range of the display.

Encoding techniques, such as gamma encoding or correction, have been implemented that utilize data compression for improving bandwidth efficiency while improving matching of human brightness perception. These encoding techniques are directed to allocating increased bandwidth to brightness levels where human perception is more sensitive, such as darker levels, while conserving bandwidth for brightness levels where human perception is difficult to differentiate, such as high bit counts and brightness levels with many different colors. It is commonplace for camera manufacturers to implement various encoding schemes in attempts to more efficiently use camera equipment. Compromises are made, particularly with respect to data bandwidth (file size, or the ability to record at given speed/resolution). While RAW format is generally preferred for quality, it isn't always practical, and generally unnecessary if good encoding is used. Another consideration for camera manufacturers is the processing capability of the processor in any given camera system. Generally, faster and more expensive processors may be needed to implement more complex encoding schemes.

According to principles of the present disclosure, pseudo exponential encoding schemes are implemented that provide efficient bandwidth usage while reducing size, cost and complexity of hardware resources. In this manner, the present disclosure provides improved access to high dynamic range with reduced complexity. By way of example, 8-bit encoded data is subject to pseudo-exponential transformation to provide 19 or 24-bit data according to principles of the present disclosure. As used herein, pseudo-exponential encoding/decoding or pseudo-exponential transformation refers to encoding and decoding techniques that include placement and/or transformation of certain data bits while at least one data bit is introduced in a manner that deviates from exponential transformation. For example, a first set of bits (i.e., mantissa) may be shifted into an internal register and then further shifted with an additional shift into the internal register according to a second set of bits (i.e., exponent). The second set of bits may be shifted in a manner that avoids duplicating "0" values. For example, after initially shifting the mantissa, a single bit is then shifted into the mantissa as a "0" if the exponent is zero and a "1" for all other values. A modified exponent may then be calculated. In view of the further shifting that follows the above-described if/then logic for avoiding duplicate "0" values, the second set of bits may be referred to as a pseudo-exponent. In this regard, the term pseudo exponent refers to an exponent that is not used in a traditional manner as is common in typical coding number systems, such as floating point number systems. The terms exponent relationship and exponent notation generally have different well-defined meanings. As used herein, the term exponent will generally refer to its use in the disclosed pseudo exponent, unless otherwise defined. As used herein, reference to an exponent or exponential notation using base two is a preferred embodiment for binary digital implementations.

FIG. 1 is a block diagram 10 illustrating a system level control scheme for a lighting device using cascade communication for serially connected LED packages 12 according to principles of the present disclosure. The lighting device may embody an LED display and each LED package 12 may form an LED pixel of the display. For such applications, the terms LED package and LED pixel may be used interchangeably, although it is recognized that an LED package may be composed of several LED pixels formed together in one component. An exemplary LED string 14 arranged for serial communication is indicated by a dashed box in FIG. 1. While only the single LED string 14 is provided in detail, one or more other LED strings may also be coupled with a controller 16. The controller 16 may comprise an integrated circuit, such as one or more of an ASIC, a microcontroller, a programmable control element, and an FPGA. In certain embodiments, the controller 16 may be referred to as a master controller for the LED string 14. In other embodiments, the controller 16 may be a sub-controller to which another master controller (not shown) delegates a set of tasks as it pertains to a larger system. A data signal out (Dout) of the controller 16 may be passed along the LED string 14 in a serial manner, and a return data signal in (Din) may be received back by the controller 16. The signal may include an original clock domain provided by the controller 16 or another master controller as described above. In FIG. 1, each LED package 12, or LED pixel, is provided with a label such as "Px 1,1" where the first number represents a row, and the second number represents a column. Each LED package 12 includes its own active electrical element 18 that is registered and housed therewithin so that each LED package 12 comprises logic for responding to received data signals.

According to the arrangement of FIG. 1, important aspects include delivery of high bit depth data to incorporated LED drivers within each LED package 12 and being capable of converting data effectively to energize the LED chips within each LED package 12 according to expected light output levels with increased dynamic range. In certain aspects, LED packages 12 and associated active electrical elements 18 are capable of transforming received data by way of compression and/or decompression techniques such as gamma function or correction. However, as this transformed data is used for input to a PWM driver, certain values may not produce the expected response from LED chips due to duplication of zero values during exponential decoding. As disclosed herein, LED packages 12 and related methods are disclosed where pseudo-exponential transformation is applied to avoid duplication of zero values.

Figure 2:
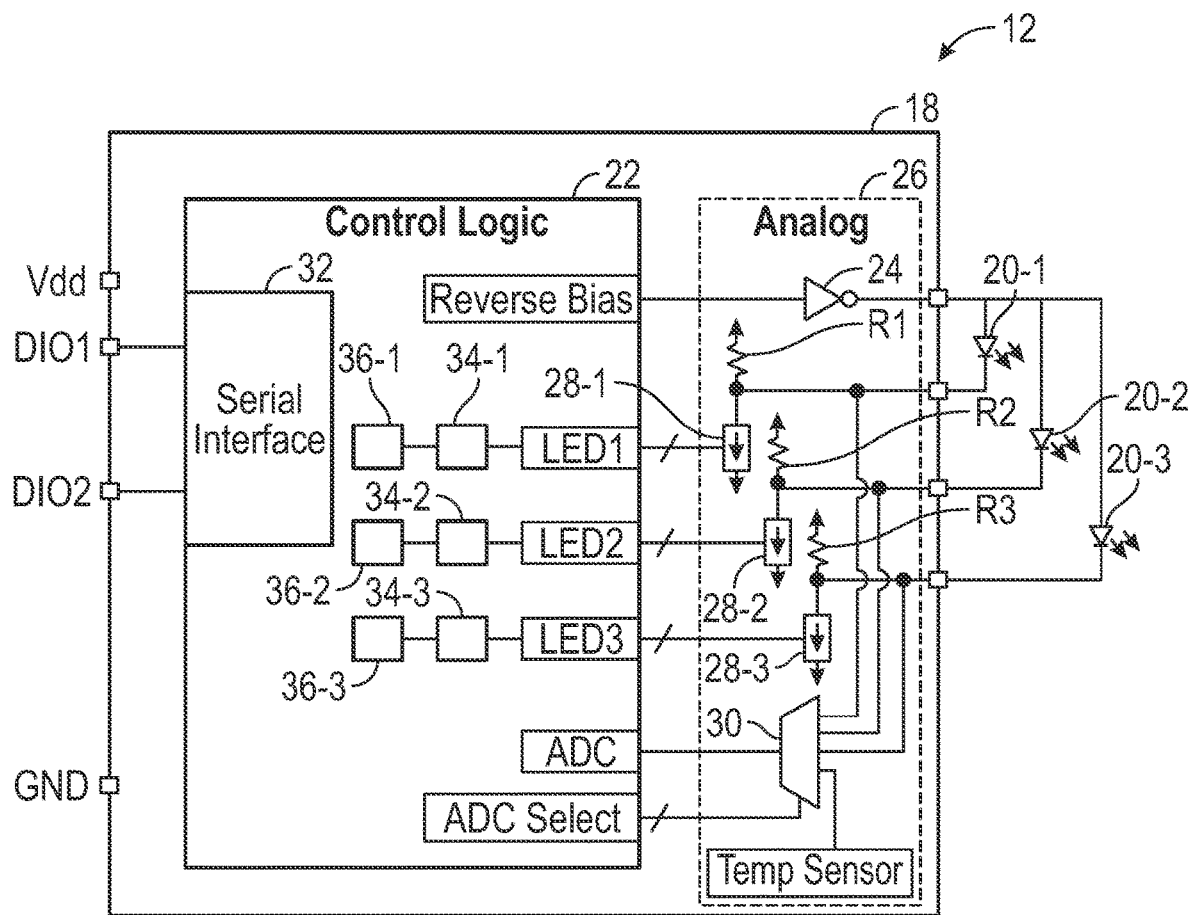
FIG. 2 is a block diagram of an LED package from FIG. 1 capable of implementing pseudo-exponential transformation according to principles of the present disclosure.

FIG. 2 is a block diagram of an LED package 12 from FIG. 1 capable of implementing pseudo-exponential transformation according to principles of the present disclosure. The active electrical element 18 may include multiple ports represented by a supply voltage (Vdd), ground (GND), and bidirectional communication ports or digital input/output ports (DIO1 and DIO2) according to embodiments disclosed herein. By having the DIO1 and DIO2 ports configured as bidirectional ports, the active electrical element 18 may advantageously be able to detect an input signal from a communication channel and then assign one of the DIO1 and DIO2 ports as an input port and the other of the DIO1 and DIO2 ports as the output port. Such functionality may be provided by input/output buffers and/or an active switching network internal to the active electrical element and electrically coupled to the DIO1 and DIO2 ports. This provides flexibility in layouts for displays where a plurality of LED packages 12 are connected together for cascade communication. For example, multiple LED packages 12 may be arranged in multiple rows where data cascades from package-to-package along each row and in a serpentine manner from row-to-row as illustrated in FIG. 1. In such arrangements, the bidirectional communication ports allow the LED packages 12 to be mounted in a same orientation and receive and transmit digital communication left-to-right or right-to-left depending on the row position. In addition to the four ports of Vdd, GND, DIO1, and DIO2 on the left side of the block diagram, the active electrical element 18 includes four ports on the right side that are coupled with LEDs 20-1 to 20-3 of the LED package 12. In this regard, the LEDs 20-1 to 20-3 are packaged together with the active electrical element 18 in the common LED package 12 to form an individual pixel of a larger display. As used herein, the LEDs 20-1 to 20-3 may also be referred to as LED chips.

Certain elements of the active electrical element 18 are described below; however, it is understood that the active electrical element 18 may include many other components, including memory elements, signal conditioning elements, thermal management, electrostatic discharge elements, clock elements, and oscillators, among others. In FIG. 2, control logic 22 is arranged to receive input data, execute commands according to a command protocol, provide control signals for operation of the LEDs 20-1 to 20-3, report various voltage levels and/or temperature levels included with output data, and transmit the output data via the DIO1 and DIO2 ports to the next adjacent LED package.

The control logic 22 may operate in the digital domain and may include input/output buffers electrically coupled to the DIO1 and DIO2 ports that assign input and output configurations for the bidirectional DIO1 and DIO2 ports.

In certain embodiments, the active electrical element 18 may be configured to provide both forward and reverse bias states to the LEDs 20-1 to 20-3. In this regard, the control logic 22 may include a reverse bias control output signal that, with appropriate active elements, is configured to supply either near-Vdd or near-GND voltage levels to the LEDs 20-1 to 20-3. Since the nomenclature "reverse bias" implies that a high level on the control logic 22 output produces a reverse bias condition, the output signal could simply be coupled with an inverter 24 that is provided in a driver 26 of the active electrical element 18. As such, the LEDs 20-1 to 20-3 may be either forward biased or reverse biased depending on a particular operating state and/or command received by the control logic 22. The inverter 24, or inverter logic element, may have sufficient output characteristics to drive the LEDs 20-1 to 20-3. The driver 26 may be substantially an analog interface of the active electrical element 18 that is electrically coupled with the control logic 22. The driver 26 may include controllable current sources 28-1 to 28-3, which could also be configured as LED sink drivers. Pull-up resistors R1 to R3 may be incorporated to provide paths to Vdd for each of the LEDs 20-1 to 20-3, which aid with the voltage measurement when configured for reverse bias. Each of the current sources 28-1 to 28-3 may be electrically coupled with digital output signals LED1 to LED3 of the control logic 22. The output signals LED1 to LED3 may be provided along multiple wires that are coupled to each of the current sources 28-1 to 28-3 for current selection purposes. The output signals LED1 to LED3 may embody PWM outputs of the control logic 22 for controlling operation of the LEDs 20-1 to 20-3. As will be later described for FIG. 3 in greater detail, each current source 28-1 to 28-3 in FIG. 2 includes multiple current sources at varying current levels to provide varying current PWM control to each LED chip 20-1 to 20-3. In this regard, each current source 28-1 to 28-3 may be referred to as an overall current source for a particular one of the LED chips 20-1 to 20-3 such that each overall current source is composed of multiple individual current sources at different current levels. The driver 26 may also include a multiplexer 30 electrically coupled with an analog-to-digital (ADC) converter and ADC selector of the control logic 22. Additionally, the driver 26 may include an on-chip temperature sensor that is provided through the multiplexer 30. In certain embodiments, the temperature sensor provides thermal compensation for the LEDs 20-1 to 20-3 via a thermal compensation curve and/or thermal shut down.

The active electrical element 18 further comprises a serial interface 32 that embodies a module with circuitry configured to decode and convert the incoming signal of the data stream into a bitstream in a local clock domain, which can be further processed by the control logic 22. In this manner, the serial interface 32 may also be referred to as a digital communication receiving device. The digital communication could be received from a controller (e.g., 16 of FIG. 1) and/or another LED package (e.g., 12 of FIG. 1) in a serial string. The serial interface 32 may receive compressed data and retransmit a combination of the same data along with modified data to the communication channel to which another LED package or another external element is connected in a manner that is compatible with the overall LED display system.

In certain embodiments, the control logic 22 may include circuitry in the form of one or more PWM processors 34-1 to 34-3 that provide the output PWM signals LED1 to LED3. A separate PWM processor 34-1 to 34-3 may be provided for each LED chip 20-1 to 20-3, or the PWM processors 34-1 to 34-3 may be combined as single PWM processor for all of the LED chips 20-1 to 20-3.

In certain embodiments, the one or more PWM processors 34-1 to 34-3 are configured to transform input PWM signals and then shift the transformed PWM values so pulse widths are provided to the LED chips 20-1 to 20-3 that compensate for delayed turn-on times.

The control logic 22 may further include circuitry in the form of one or more decoders 36-1 to 36-3 that have outputs that feed the PWM processors 34-1 to 34-3. A separate decoder 36-1 to 36-3 may be provided for each LED chip 20-1 to 20-3, or the decoders 36-1 to 36-3 may be combined as single decoder for all of the LED chips 20-1 to 20-3. As will be described later in greater detail, the decoders 36-1 to 36-3 are configured to decode the compressed data received by the serial interface 32 and apply pseudo-exponential transformation according to principles of the present disclosure. In this manner, duplicate "0" values that would otherwise be sent to the PWM processors 34-1 to 34-3 are avoided.

Figure 3:
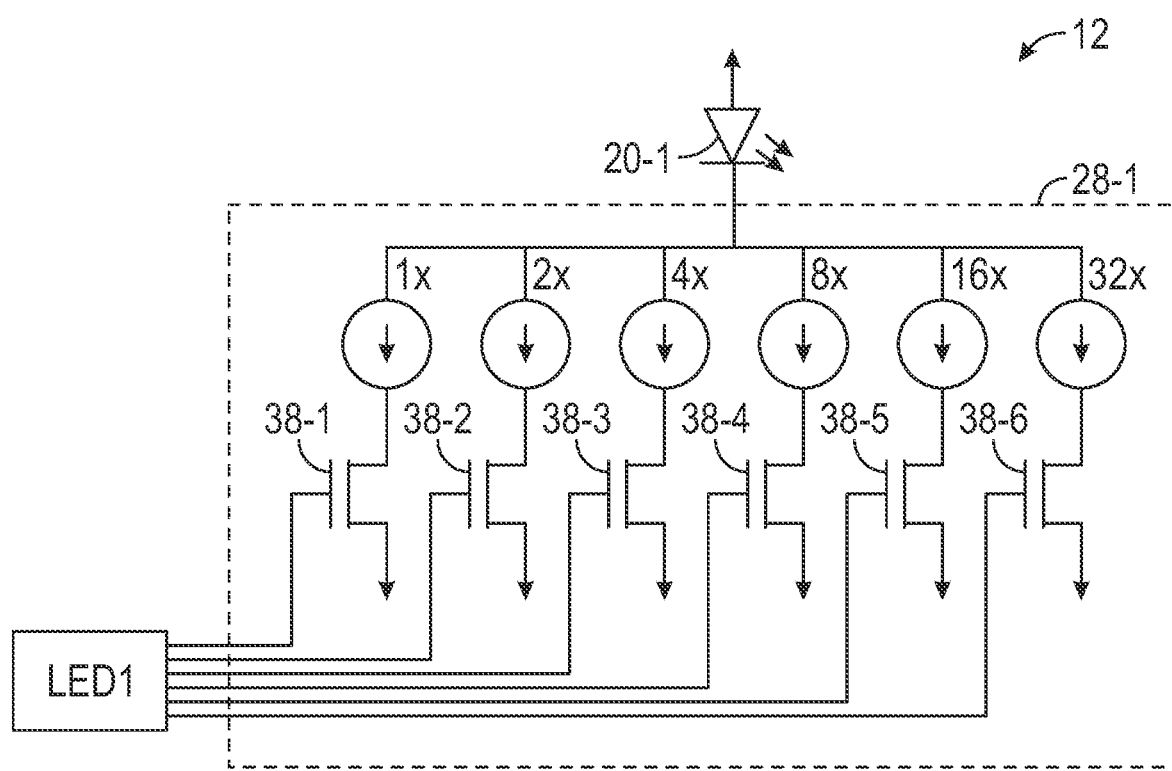
FIG. 3 is a schematic diagram of a portion of the LED package of FIG. 2 illustrating details of a current source for an LED chip of the LED package.

FIG. 3 is a schematic diagram of a portion of the LED package 12 of FIG. 2 illustrating details of the overall current source 28-1 for the LED chip 20-1. While FIG. 3 is discussed in the context of the overall current source 28-1 for providing varying current PWM to the LED chip 20-1, it is understood that principles described are also applicable to each overall current source 28-1 to 28-3 of FIG. 2. In this manner, the overall current sources 28-2, 28-3 may also be configured for respectively providing varying current PWM to the LED chips 20-2, 20-3 of FIG. 2 in the same manner. By way of example, the overall current source 28-1 in FIG. 3 is illustrated with six current sources labeled as 1X, 2X, 4X, 8X, 16X, and 32X. However, the principles described are applicable to any number of multiple current sources for the LED chip 20-1.

As illustrated in FIG. 3, each current source 1X, 2X, 4X, 8X, 16X, and 32X is coupled to the same LED chip 20-1 for delivering different PWM current levels. By way of example, the current source 2X delivers two times the current as the current source 1X, the current source 4X delivers four times the current as the current source 1X, and so on. In this manner, each sequential current source 1X, 2X, 4X, 8X, 16X, and 32X provides double the current level of the previous one. As illustrated, each current source 1X, 2X, 4X, 8X, 16X, and 32X is coupled to a different output (e.g., different wire or electrically conductive path) of the output PWM signal LED1. In this manner, the output PWM signal LED1 is distributed to separately control a separate switch 38-1 to 38-6, such as a metal-oxide-semiconductor field-effect transistor (MOSFET), associated with each current source 1X, 2X, 4X, 8X, 16X, and 32X. Accordingly, depending on an intended brightness level for the LED chip 20-1, the output PWM signal LED1 may selectively turn on one or more of the current sources 1X, 2X, 4X, 8X, 16X, and 32X during a PWM period, thereby providing increased non-zero brightness levels. In certain embodiments, the choice to have the current levels step by powers of two conveniently matches the current to a binary number encoded within the parallel output of the PWM signal LED1, thus providing a linear relationship between the current and the binary output value. However, other multi-current schemes are contemplated, such as having at least two or even all of the current source set to the same current. By way of example, a particular configuration may have at least two current sources that are the same (e.g., 1X, 1X) while having others that differ (e.g., 2X, 4X, 8X, . . . ). In other embodiments, the current levels may be intentionally tuned to values different than those representing exact powers of two in order to compensate for other nonlinearities or variation within the system.

As illustrated in FIGS. 2 and 3, the LED driver 26, current sources 28-1 to 28-3, PWM processors 34-1 to 34-3, and decoders 36-1 to 36-3 are advantageously incorporated within the active electrical element 18 of an LED package 12. In this regard, the LED package 12 may form an LED pixel configured for active matrix addressing in an LED display. However, the principles disclosed herein are applicable to other implementations, such as light-emitting devices (e.g., systems or displays) where such circuitry is separated from each LED package or LED pixel. The principles described with respect to FIG. 3 for varying current levels within a PWM period may be implemented in combination with pseudo-exponential transformation as described above and for FIGS. 4 and 5.

Figure 4A:
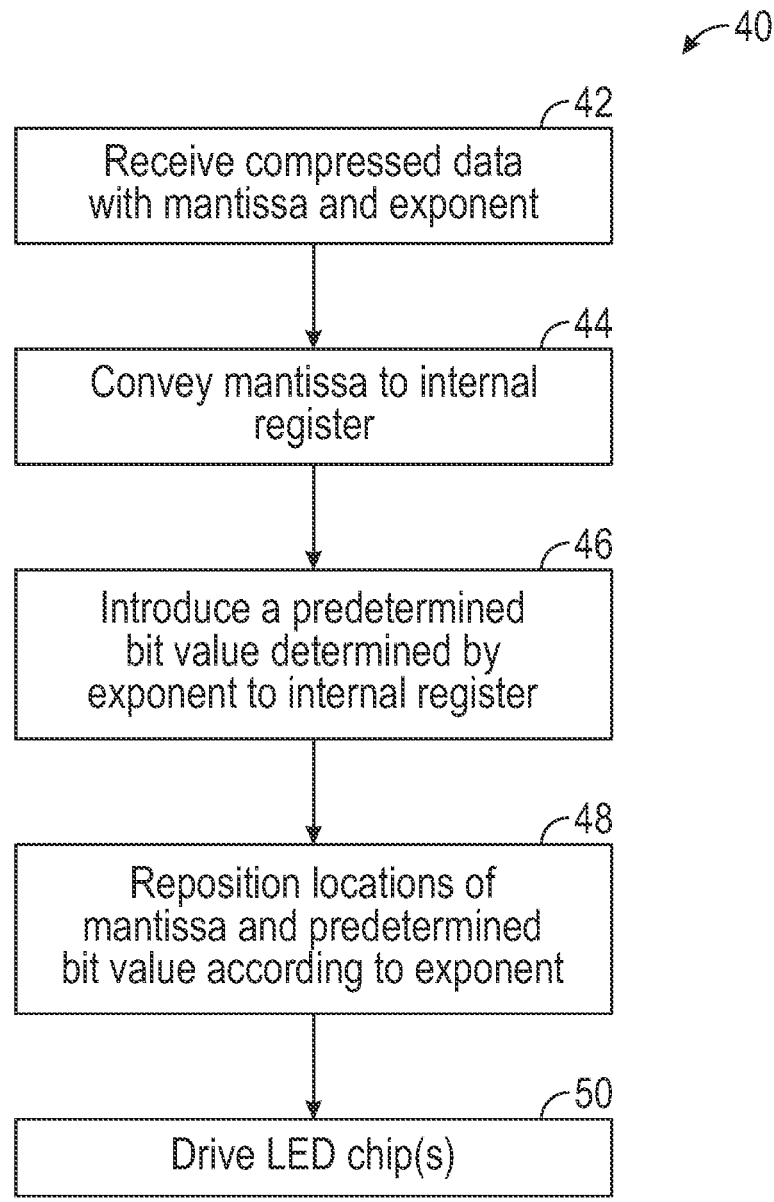
FIG. 4A is a schematic diagram illustrating a process flow for implementation of pseudo-exponential transformation according to principles of the present disclosure.

FIG. 4A is a schematic diagram illustrating a process flow 40 for implementation of pseudo-exponential transformation according to principles of the present disclosure. In a first step 42, an LED device receives compressed data from a data stream. In the context of the LED package 12 of FIG. 2, the compressed data may be received by the serial interface 32. While the principles described are applicable to many different data sizes, the compressed data will be described in the form of 8-bit data as an exemplary implementation. The 8-bit data may include a first set of data bits (i.e., mantissa) and a second set of data bits (i.e., exponent). For reference, the 8-bit data may be represented as "eeee_mmmm" where "m" is the mantissa and "e" is the exponent. As described herein, the compressed data is decompressed or decoded into an internal register. In the context of the LED package 12 of FIG. 2, the decoder 36-1 to 36-3 comprises the internal register, which may also be referred to as a shift register. As used herein, an internal register or shift register may refer to any memory element capable of holding data. By way of example, the 8-bit data received in the first step 42 may be decoded to a 24-bit register, which may be generally represented as "0000_0000_0000_0000_0000_0000".

In a second step 44, the mantissa is conveyed to the internal register. By way of example, for serial bit shifting embodiments, a first shift may be applied to the mantissa from left to right and the 24-bit register may be represented in 24-bit format as "mmmm_0000_0000_0000_0000_0000". While the present embodiment is discussed in the context of left-to-right shifting, the principles described are equally applicable to shifting right-to-left.

In a third step 46, a predetermined bit value is introduced to the internal register. In the serial bit shifting example, a second shift is applied where at least one data bit (i.e., the predetermined bit value) is shifted based on the exponent and the 24-bit register may now be represented as "bmmm_m000_0000_0000_0000_0000" where "b" is the data bit shifted at the third step 46. The shifting of the value for "b" is provided to avoid duplicating exponent values of zero for every instance where the mantissa is zero. In this manner, if the exponent is zero, then the "b" value is "0". For all other values where the exponent is not zero, then the "b" value is "1".

In a fourth step 48, locations of the mantissa and the predetermined bit value are repositioned according to the exponent. In this manner, a modified exponent, referred to hereinafter as eeee', may be calculated. When the exponent value is zero (i.e., "eeee=0000"), the modified exponent (eeee') may be calculated by taking ones' complement and subtracting "1" from it. For all other nonzero values of the exponent, eeee' is calculated by takings ones' complement and without subtracting "1" from it. The calculation may be represented by the formula below where the ones' complement operator is "~" and signifies inversion of all bits.

$$eeee' = \begin{cases} \sim eeee - 1, \text{ if } eeee = 0000 \\ \sim eeee, \text{ otherwise} \end{cases}$$

As indicated, if the exponent value is not zero, the process flow may advance without subtracting "1". The eeee' values are not shifted into the 24-bit register in the manner as the mantissa. Instead, zeros are shifted from the left according to the eeee' value (i.e., shift the 24-bit register right eeee' times).

In a fifth step 50, the contents or data bit values of the 24-bit register are sent to other circuitry (e.g., PWM processors 34-1 to 34-3 and current sources 28-1 to 28-3 of FIG. 2) to drive one or more LED chips.

As described above, the process flow 40 of FIG. 4A avoids duplicating overall zero values for every instance the mantissa is zero for improved high dynamic range. Since the third step 46 described above shifts in a "1" for all nonzero exponent values, the decompressing does not entirely follow standard exponent decompression. Accordingly, the process flow 40 may be referred to as pseudo-exponential encoding/decoding and/or pseudo-exponential transformation. By way of example, Table 1 below provides the pseudo-exponential transformation of examples of the 8-bit compressed data (eeee_mmmm) for various exponent values after completion of the fourth step 48. For example, the first row provides the example where the exponent values are zero such that 0000_mmmm results in a 24-bit register of 0000_0000_0000_000m_mmm0_0000 after the fourth step 48.

TABLE 1

| 8-bit Compressed Data | Resulting 24-bit Register |
|---|---|
| 0000_mmm | 0000_0000_0000_000m_mmm0_0000 |
| 0001_mmm | 0000_0000_0000_001m_mmm0_0000 |
| 0010_mmm | 0000_0000_0000_01mm_mm00_0000 |
| 1111_mmm | 1mmm_m000_0000_0000_0000_0000 |

As observed in table 1, the rightmost 5 bits of the 24-bit shift register can never be used for this case where the compressed data composes 4 exponent bits and 4 mantissa bits. However, other configurations with more mantissa bits or more exponent bits may utilize the full 24-bit register.

Figure 4B:
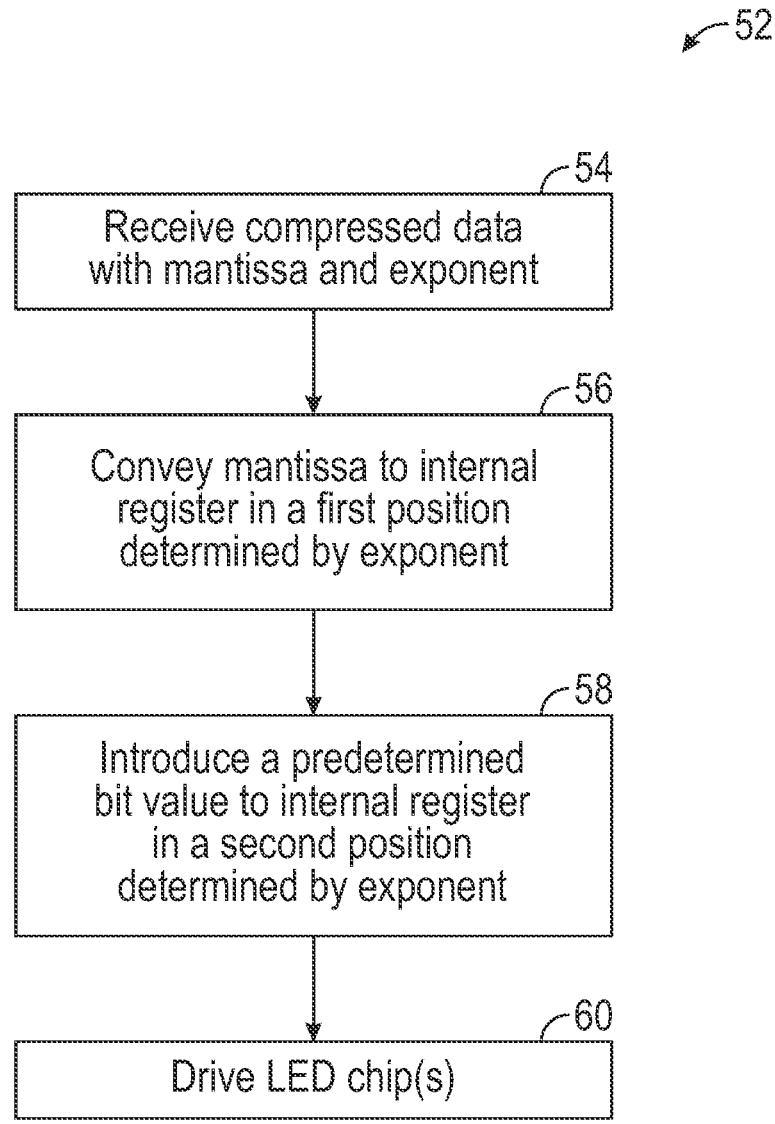
FIG. 4B is a schematic diagram illustrating a general process flow for implementation of pseudo-exponential transformation according to principles of the present disclosure.

While FIG. 4A is described in the context of serial bit shifting embodiments, the principles are generally applicable to implementations where bits are placed in positions in any sequence, including parallel, serial, or other operations. In a general context, the aspects described above for FIG. 4A may be implemented according to the below principles for FIG. 4B. In this manner, FIG. 4B is a schematic diagram illustrating a general process flow 52 for implementation of pseudo-exponential transformation according to principles of the present disclosure. In FIG. 4B, a first step 54 is the same as described above for the first step 42 of FIG. 4A. In FIG. 4B, the second step 56 and the third step 58 may occur in any order. The second step 56 involves conveying the mantissa to the internal register and the mantissa will ultimately reside in a first position that is determined by the exponent. The third step 58 involves introducing the predetermined bit value to the internal register and the predetermined bit value may ultimately reside in a second position that is also determined by the exponent. In certain embodiments, the first and second positions may be set as the mantissa and the predetermined bit value are conveyed to the internal register. In other embodiments, the mantissa and the predetermined bit value may reach the first and second positions after they are initially conveyed in the internal register. The below paragraphs describe how the first and second positions may be calculated.

In FIG. 4B, the received compressed data at the first step 42 may be referred to as an encoded value made up of $n_e + n_m$ bits where $n_e$ is the number of exponent bits and $n_m$ is the number of mantissa bits. The decoded value ends up in the internal register (second and third steps 56, 58) capable of holding $n_{reg}$ bits. Depending on these bit numbers, there may be unused bits in the internal register or some of the least significant bits may be lost. The number of extra bits eb is represented by the below formula.

$$eb = n_{reg} - n_m - 2^{n_e} + 1$$

When the extra bits eb is a positive, the extra bits result in zeros padding the least significant bits in the internal register. When the eb is a negative, the number of bits indicated may be lost. By way of an 8-bit example for a 24-bit register, the extra bits eb may follow the calculation below.

$$eb = 24(n_{reg}) - 4(n_m) - 16(2^{n_e}) + 1 = 5$$

In this general example, data may be placed according to the formula below where result is the decoded value that ends up in the result register, m is the value of the mantissa, and e is the value of the exponent.

$$result = \begin{cases} m2^{eb}, & \text{if } e = 0 \\ (m + 2^{n_m})2^{(e+eb-1)}, & \text{otherwise} \end{cases}$$

In the formula above, if the exponent e is zero, then the mantissa m is put in a position depending on the number of extra bits. Otherwise, as indicated in the first factor, the mantissa m has another positional shift according to the exponent e, starting from the position such that e is equal to one produces a same position as when e is equal to zero. As indicated in the second factor, a one, represented by $2^{n_m}$, is added to the next more significant position as the most significant position of the mantissa m.

For examples without extra bits (eb=0), the above formula may be represented as follows.

$$result = \begin{cases} m2^e, & \text{if } e = 0 \\ \frac{1}{2}(m + 2^{n_m}), & \text{otherwise} \end{cases}$$

Accordingly, the top condition ($m2^e$) represents a true mantissa-with-exponent relationship and the pseudo-exponent principles described herein are equivalent if e=0. The top condition would be equal to the bottom condition if $m=2^{n_m}$. This almost occurs when m is at its maximum value (for all exponent, e, values). For the example with a 4-bit mantissa, the maximum value for m=15 and $2^{n_m}$=16 which makes the bottom condition nearly the same as the top. When the mantissa is less than its maximum value, it deviates from the true mantissa-with-exponent, but with improved results. The pseudo-exponential principles described herein are monotonic, and values are repeated only if the result register is not wide enough to accommodate the full range.

Figure 5:
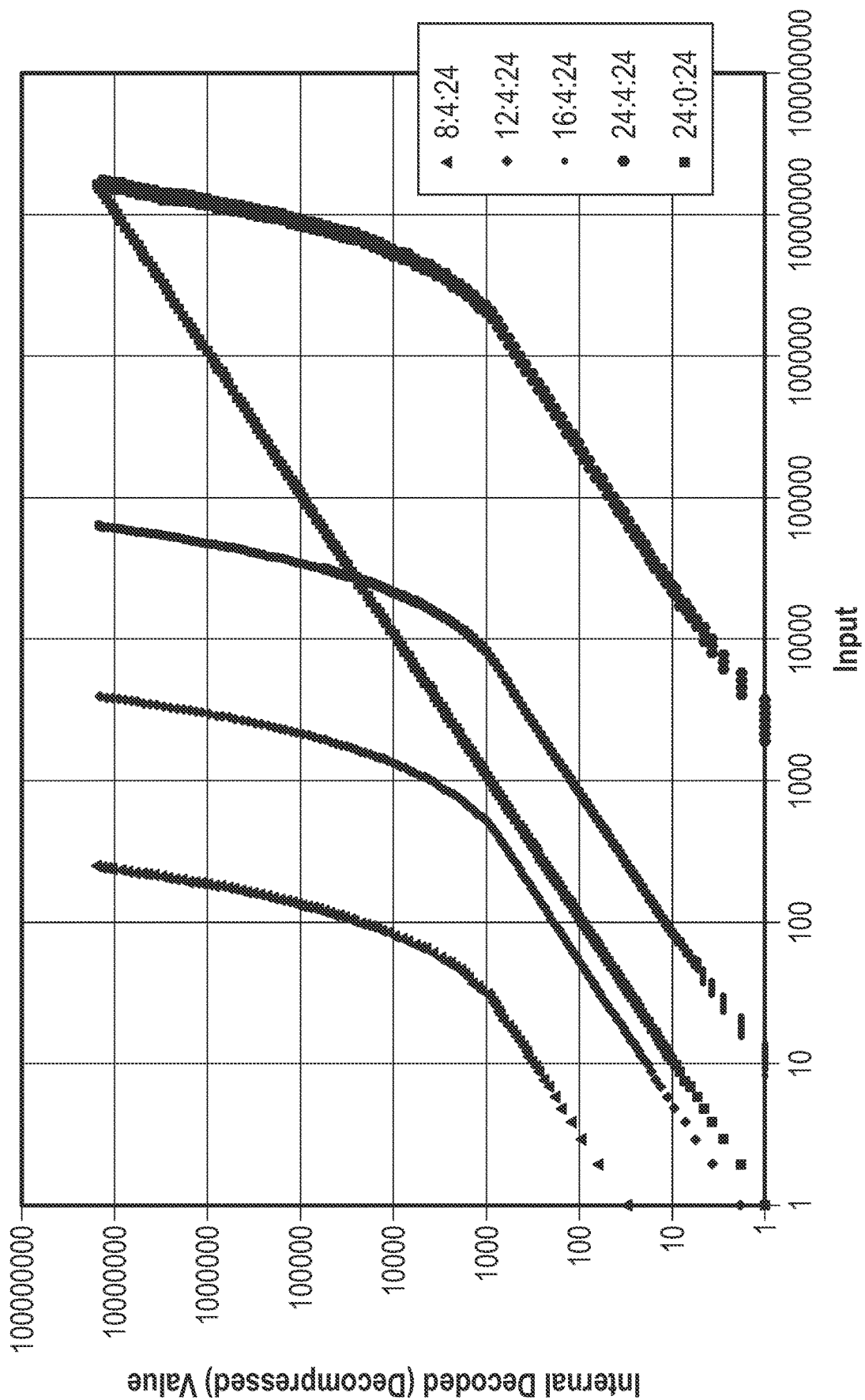
FIG. 5 is a plot representing pseudo-exponential transformation for various combinations of data according to principles of the present disclosure.

FIG. 5 is a plot representing pseudo-exponential transformation for various combinations of data according to principles of the present disclosure. The x-axis represents the input (i.e., compressed) data values and the y-axis represents the internal decompressed value. The plot lines are labeled with a series of three numbers separated by colons in the format of (exponent+mantissa):exponent:d, where exponent+mantissa represents the total number of bits in compressed format and may be referred to as the input width, exponent represents the number of bits in the exponent and may be referred to as the exponent width, and d represents the number of decoded, decompressed bits and may be referred to as the internal width. In this regard, the plot line 8:4:24 represents 8-bit compressed data with a 4-bit exponent that is decoded to 24 bits in the internal register. In certain embodiments, the number of decoded, decompressed bits may be more or less than the internal width the shift register can support. In instances where the internal register is smaller than the input data, the least significant bit(s) shift out and are lost, resulting in lower dynamic range as it is limited by the physical width of the shift register. For comparison, the straight line for 24:0:24 with an exponent width of zero (i.e., no exponent) is provided to represent encoding turned off. As illustrated, while the plot lines 8:4:24 and 12:4:24 may not cover the entire range at lower levels, they do provide very good pseudo-exponential transformation for improved dynamic range with an aesthetically pleasing response for a human viewer. This lack of filling out the full range of the internal shift register was already seen for the 8:4:24 case in Table 1 where the case where eeee=0000 did not shift the mantissa to the rightmost end of the shift register, lacking 5 bits. The plot line 16:4:24 covers the whole range albeit with a few initial repeat values. The plot line 24:4:24 with the highest input width demonstrates reduced resolution at the first several thousand values. Accordingly, tradeoffs between resolution and range exist with some preferred embodiments using 4-bits for the exponent width and variable numbers of bits for the mantissa width. Lower exponent widths may not sufficiently extend the dynamic range for certain applications.

Figure 6:
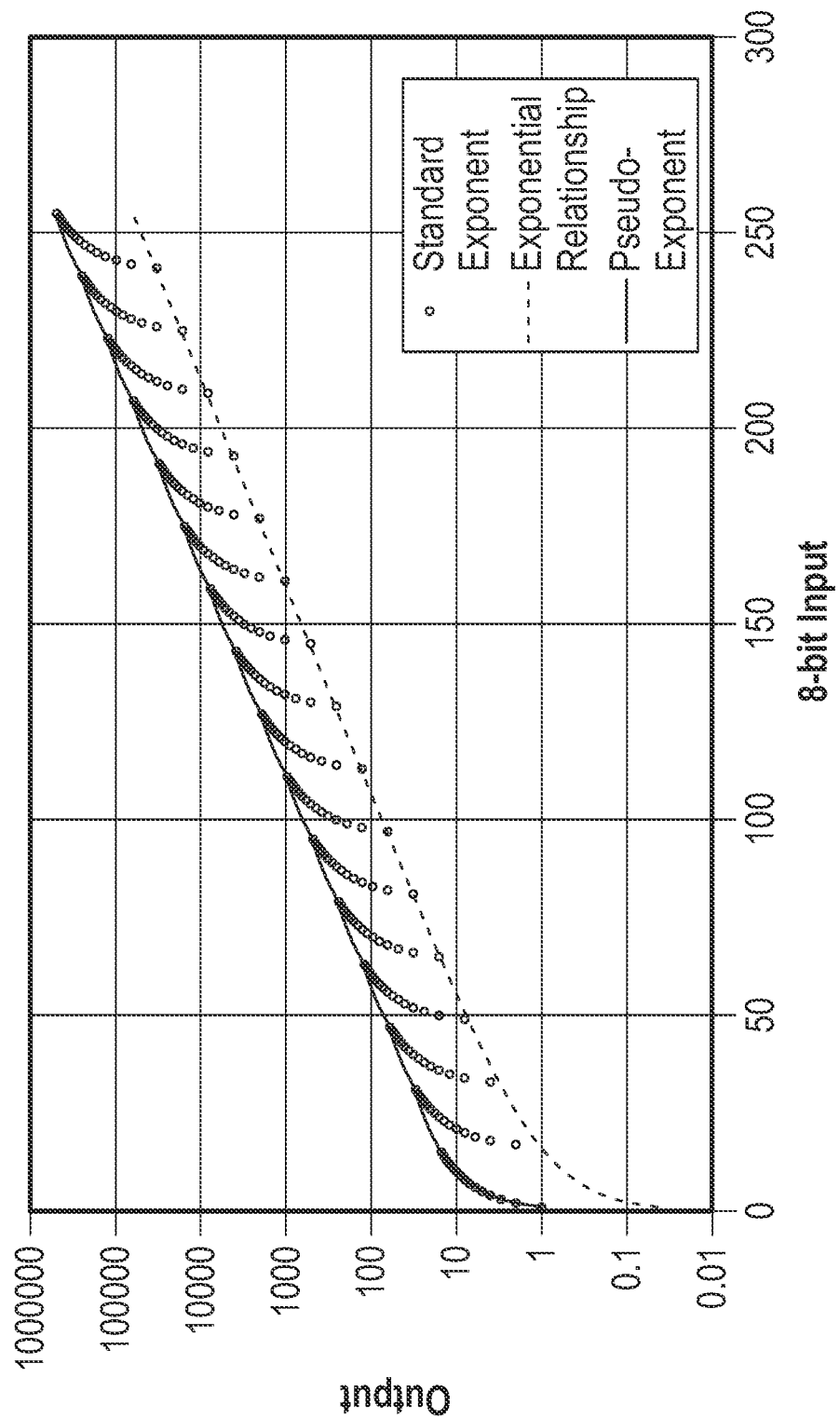
FIG. 6 is a plot representing three different types of exponential decoding and encoding to compare the principles of the present disclosure.

FIG. 6 is a plot representing three different types of exponential decoding and encoding to compare the principles of the present disclosure. The x-axis represents input data for an 8-bit example and the y-axis represents the output. The plot line labeled Exponential Relationship refers to a standard exponential relationship that would be a good substitute for gamma correction and similar implementations may be present in camera applications. However, this example requires intense mathematical calculations and accordingly requires complex hardware requirements that may not be suitable for all applications, such as light-emitting devices and/or LED packages as pixels in a display. The plot line labeled Standard Exponent refers to a true mantissa with exponent implementation that does not follow the principles of the present disclosure for avoiding duplicate zero values. In this manner, undesirable decompression is produced such that each value of the exponent is zero when the mantissa is zero and the sections overlap. The resulting plot line corresponds with an unaesthetically pleasing dynamic range. The plot line labeled Pseudo-Exponent represents the principles of the present disclosure as described above for FIG. 4B. Accordingly, the pseudo exponential encoding of the present disclosure provides improved results while avoiding the need for complex hardware required to provide intense mathematical calculations.

Accordingly, pseudo-exponential transformation techniques described above for FIGS. 1 to 6 provide significant advantages over standard exponential decompression. Common practice would be to use a gamma or power-law expression which doesn't have the duplicate-value problem but requires complex hardware to perform the calculation. Pseudo-exponential encoding and/or transformation as described herein provides a much simpler method and apparatus utilizing simple bit manipulation operations such as shifting, inversion, and one decrement operation. This reduced complexity thereby allows reduced die size for operation with reduced associated costs.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method of light output control for a light-emitting diode (LED) device, the method comprising:
   receiving compressed data comprising a first set of data bits and a second set of data bits, wherein the first set of data bits is a mantissa and the second set of data bits is an exponent;
   conveying the mantissa to an internal register in a first position determined by the exponent;
   introducing a predetermined bit value to the internal register in a second position determined by the exponent, wherein the predetermined bit value is placed in a next more significant position immediately adjacent to the mantissa; and
   driving at least one LED chip according to contents of the internal register, the contents being based on the mantissa and the exponent.

2. The method of claim 1, wherein the first position correlates to taking the value of two to the exponential power of the exponent when the exponent is not zero, and the first position is equivalent to the case having the exponent equal to one when the exponent is zero.

3. The method of claim 1, wherein the predetermined bit value is a single bit with a value of one when the exponent is not zero.

4. The method of claim 1, wherein:
   conveying the mantissa to the internal register comprises applying a first shift by shifting the mantissa into the internal register; and
   introducing the predetermined bit value comprises applying a second shift where the predetermined bit value is shifted into the internal register.

5. The method of claim 4, wherein applying the second shift comprises shifting a bit value of zero for a data bit when the exponent is zero and shifting a bit value of one for the data bit for all other exponent values.

6. The method of claim 5, further comprising calculating a modified exponent by taking the ones' complement of the exponent.

7. The method of claim 6, wherein the modified exponent is further modified by subtracting a value of one when the exponent is zero.

8. The method of claim 7, wherein the internal register is further shifted according to the modified exponent.

9. The method of claim 1, further comprising sending the contents of the internal register to circuitry for driving the at least one LED chip.

10. The method of claim 9, wherein the circuitry comprises at least one pulse width modulation (PWM) processor and driver circuitry coupled to the at least one LED chip.

11. The method of claim 10, wherein the driver circuitry comprises a plurality of current sources configured to provide varying current levels based on an output PWM signal of the at least one PWM processor.

12. The method of claim 11, wherein the at least one LED chip, the driver circuitry, and the at least one PWM processor are integrated together to form an LED package.

13. The method of claim 4, wherein the first shift and the second shift are performed from left to right within the internal register.

14. The method of claim 4, wherein the first shift and the second shift are performed from right to left within the internal register.

15. A light-emitting device comprising:
   a light-emitting diode (LED) chip;
   a serial interface configured to receive compressed data comprising a first set of data bits and a second set of data bits, wherein the first set of data bits is a mantissa and the second set of data bits is an exponent; and
   a decoder comprising an internal register, the decoder configured to:
      convey the mantissa to the internal register in a first position determined by the exponent; and
      introduce a predetermined bit value to the internal register in a second position determined by the exponent, wherein the predetermined bit value is placed in a next more significant position immediately adjacent to the mantissa.

16. The light-emitting device of claim 15, wherein the first position correlates to taking the value of two to the exponential power of the exponent when the exponent is not zero, and the first position is equivalent to the case having the exponent equal to one when the exponent is zero.

17. The light-emitting device of claim 15, wherein the decoder is configured to convey the mantissa by applying a first shift by shifting the mantissa into the internal register, and introduce the predetermined bit value by applying a second shift where the predetermined bit value is shifted into the internal register.

18. The light-emitting device of claim 17, wherein the decoder is configured to apply the second shift by shifting a bit value of zero for the predetermined bit value when the exponent is zero or shifting a bit value of one for the predetermined bit value for all other exponent values.

19. The light-emitting device of claim 18, wherein the decoder is configured to calculate a modified exponent that is shifted into the internal register, wherein if the exponent is zero, the modified exponent is calculated by taking the ones' complement of the exponent and then subtracting a value of one, and wherein for all other exponent values, the modified exponent is calculated by only taking the ones' complement of the exponent.

20. The light-emitting device of claim 19, wherein the internal register is further shifted according to the modified exponent.

21. The light-emitting device of claim 19, further comprising:
   driver circuitry coupled to the LED chip, the driver circuitry configured to drive the LED chip based on contents of the internal register; and
   a pulse width modulation (PWM) processor coupled to driver circuitry, the PWM processor configured to receive the contents of the internal register.

22. The light-emitting device of claim 21, wherein the PWM processor comprises a plurality of current sources configured to provide varying current levels to the LED chip.

23. The light-emitting device of claim 21, wherein the light-emitting device is an LED package that comprises the LED chip and an active electrical element that is integrated within the LED package, the active electrical element comprising the serial interface, the decoder, the driver circuitry, and the PWM processor.

* * * * *